(12) United States Patent
Grand et al.

(10) Patent No.: US 9,641,134 B2
(45) Date of Patent: May 2, 2017

(54) CIRCUIT FOR REDUCING POP NOISE

(71) Applicant: Dolphin Integration, Meylan (FR)

(72) Inventors: Emmanuel Grand, Le Touvet (FR);
Sébastien Genevey, Gieres (FR);
Arthur Veith, Grenoble (FR); Paul Giletti, Grenoble (FR)

(73) Assignee: Dolphin Integration, Meylan (FR)

( * ) Notice: Subject to any disclaimer, the term of this patent is extended or adjusted under 35 U.S.C. 154(b) by 0 days.

(21) Appl. No.: 14/832,910

(22) Filed: Aug. 21, 2015

(65) Prior Publication Data

US 2016/0065143 A1   Mar. 3, 2016

(30) Foreign Application Priority Data

Aug. 26, 2014   (FR) ..................................... 14 57987

(51) Int. Cl.
*H03F 3/45*   (2006.01)
*H03F 1/26*   (2006.01)
*H03F 3/185*  (2006.01)
*H03F 1/30*   (2006.01)

(52) U.S. Cl.
CPC .............. *H03F 1/26* (2013.01); *H03F 1/305* (2013.01); *H03F 3/185* (2013.01); *H03F 3/45179* (2013.01); *H03F 2200/03* (2013.01); *H03F 2200/129* (2013.01)

(58) Field of Classification Search
CPC ........ H03F 1/26; H03F 3/185; H03F 3/45179; H03F 2200/03; H03F 2200/129; H03F 1/305

USPC ........................................................ 330/252
See application file for complete search history.

(56) References Cited

U.S. PATENT DOCUMENTS

| 6,940,345 B2 * | 9/2005 | Nair ....................... H03G 3/348 330/51 |
| 9,014,396 B2 * | 4/2015 | Miao ....................... H03F 1/305 330/284 |
| 2008/0219479 A1 * | 9/2008 | Ibukuro .................. H04R 3/04 381/120 |
| 2009/0196435 A1 | 8/2009 | Miao |

FOREIGN PATENT DOCUMENTS

| EP | 1879290 | 1/2008 |
| WO | WO 02/15388 A2 | 2/2002 |

OTHER PUBLICATIONS

French Search Report from French Patent Application No. 1457987 dated Jun. 16, 2015.

* cited by examiner

*Primary Examiner* — Khanh V Nguyen
(74) *Attorney, Agent, or Firm* — Wolf, Greenfield & Sacks, P.C.

(57) ABSTRACT

The invention concerns an amplifier circuit comprising: an amplifier having a first input coupled to an input node of the amplifier circuit via a first resistor and an output coupled to a load via a coupling capacitor, the output being coupled to the first input via a second resistor; and a current ramp generator adapted to supply a current ramp to the first input of the amplifier during a power up phase or power down phase of the amplifier circuit to control the rate of charge or discharge of the coupling capacitor.

20 Claims, 2 Drawing Sheets

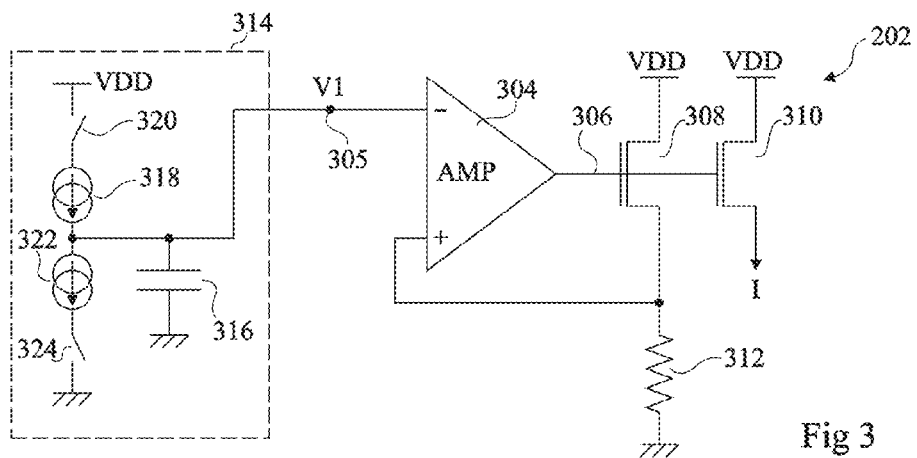
Fig 3
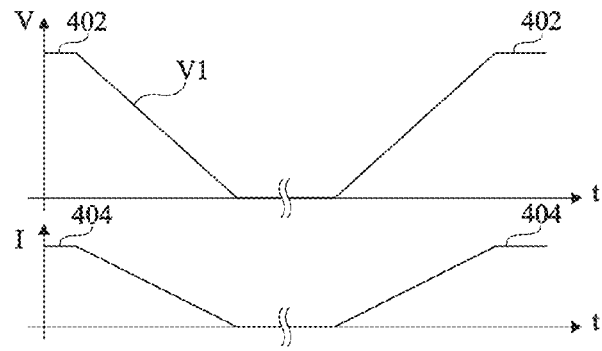
Fig 4A
Fig 4B
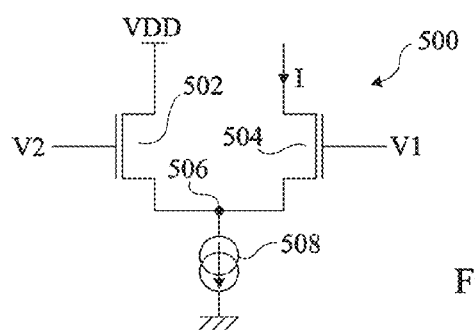
Fig 5
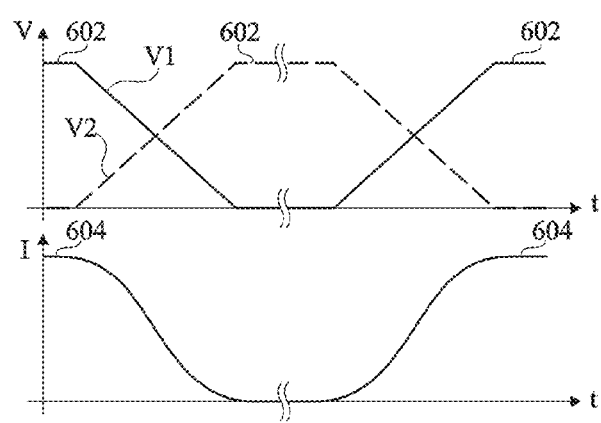
Fig 6A
Fig 6B

CIRCUIT FOR REDUCING POP NOISE

CROSS REFERENCE TO RELATED APPLICATIONS

Foreign priority benefits are claimed under 35 U.S.C. §119(a)-(d) or 35 U.S.C. §365(b) of French application number 14/57987, filed Aug. 26, 2014, entitled "CIRCUIT FOR REDUCING POP NOISE" which is incorporated herein by reference to the maximum extent allowable by law.

FIELD

The present disclosure relates to the field of audio amplifiers, and in particular to a circuit for reducing pop noise in an audio amplifier.

BACKGROUND

Pop noise is a well-known problem in audio amplifiers, and corresponds to an audible "pop" or "click" when the amplifier is turned on or off. This noise is due to the fact that the amplifier is coupled to the load, such as speakers or headphones, via a coupling capacitor. The coupling capacitor blocks the DC level at the output of the amplifier, so that the load receives only the useful audio signal. In order to permit a reasonable bass response, the coupling capacitor is generally relatively large, typically of at least 100 µF for a load of 16 ohms. Pop noise is the result of the rapid charging or discharging of this coupling capacitor when the amplifier is activated or deactivated.

The input signal of the amplifier is generally provided by a digital to analogue converter (DAC), and one solution that has been proposed for reducing pop noise is to initially control the DAC to supply a low signal to the amplifier, and to gradually increase this signal to charge the coupling capacitor. However, a drawback of such a solution is that this adds complexity to the DAC, and in some embodiments it may be desirable not to include a DAC.

There is thus a need in the art for an alternative solution for reducing pop noise at the output of an audio amplifier.

SUMMARY

It is an aim of embodiments of the present disclosure to at least partially address one or more needs in the prior art.

According to one aspect, there is provided an amplifier circuit comprising: an amplifier having a first input coupled to an input node of the amplifier circuit via a first resistor and an output coupled to a load via a coupling capacitor, the output being coupled to the first input via a second resistor; and a current ramp generator adapted to supply a linear or non-linear current ramp to the first input of the amplifier during a power up phase or power down phase of the amplifier circuit to control the rate of charge or discharge of the coupling capacitor.

According to one embodiment, during a power down phase of the amplifier circuit the current ramp generator is adapted to supply a further linear or non-linear current ramp to the first input of the amplifier, the further linear or non-linear current ramp starting at the second level and rising to the first level.

According to one embodiment, during a power up phase of the amplifier circuit the current ramp generator is adapted to supply a linear or non-linear current ramp starting at a first level and falling to a second level.

According to one embodiment, the first level is high enough to cause saturation of the amplifier.

According to one embodiment, the second level is equal to or less than 1 µA.

According to one embodiment, the linear or non-linear current ramp has a gradient that results in a voltage gradient at the output of the amplifier circuit of at least 1 V/s.

According to one embodiment, the current ramp generator is adapted to convert a first voltage ramp into the linear or non-linear current ramp.

According to one embodiment, the current ramp generator comprises a differential pair, a first of the transistors of the differential pair being controlled by the first voltage ramp.

According to one embodiment, a second of the transistors of the differential pair is controlled by a second voltage ramp having a gradient of opposite sign to the first voltage ramp.

According to one embodiment, the amplifier is coupled in an inverting amplifier configuration.

According to a further aspect, there is provided a method of powering up or powering down an amplifier circuit, comprising: supplying a linear or non-linear current ramp to a first input of an amplifier of the amplifier circuit, the first input being coupled to an input node of the amplifier circuit via a first resistor, an output of the amplifier being coupled to a load via a coupling capacitor and to the first input via a second resistor, wherein the linear or non-linear current ramp controls the rate of charge or discharge of the coupling capacitor; and applying an input signal to the input node of the amplifier circuit.

According to a further aspect, there is provided a method of powering down an amplifier circuit, comprising: supplying a linear or non-linear current ramp to a first input of an amplifier of the amplifier circuit, the first input being coupled to an input node of the amplifier circuit via a first resistor, an output of the amplifier being coupled to a load via a coupling capacitor and to the first input via a second resistor, wherein the linear or non-linear current ramp starts at a second level and rises to a first level and controls the rate of charge or discharge of the coupling capacitor; and applying an input signal to the input node of the amplifier circuit.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 3 schematically illustrates a current ramp generator of the circuit of FIG. 1 or 2 according to an example embodiment;

FIG. 4A is a graph illustrating an example of voltage ramps in the circuit of FIG. 3 according to an example embodiment;

FIG. 4B is a graph illustrating an example of current ramps generated by the circuit of FIG. 3 according to an example embodiment;

FIG. 5 illustrates the current ramp generator of FIG. 1 or 2 in more detail according to a further example embodiment;

FIG. 6A is a graph illustrating an example of voltage ramps in the circuit of FIG. 5 according to an example embodiment; and FIG. 6B is a graph illustrating an example of current ramps generated by the circuit of FIG. 5 according to an example embodiment.

DETAILED DESCRIPTION

While throughout the following description embodiments have been described based on an inverting amplifier configuration, it will be apparent to those skilled in the art that the embodiments described herein could be adapted to other types of amplifier, such as a non-inverting amplifier.

Figure 1:
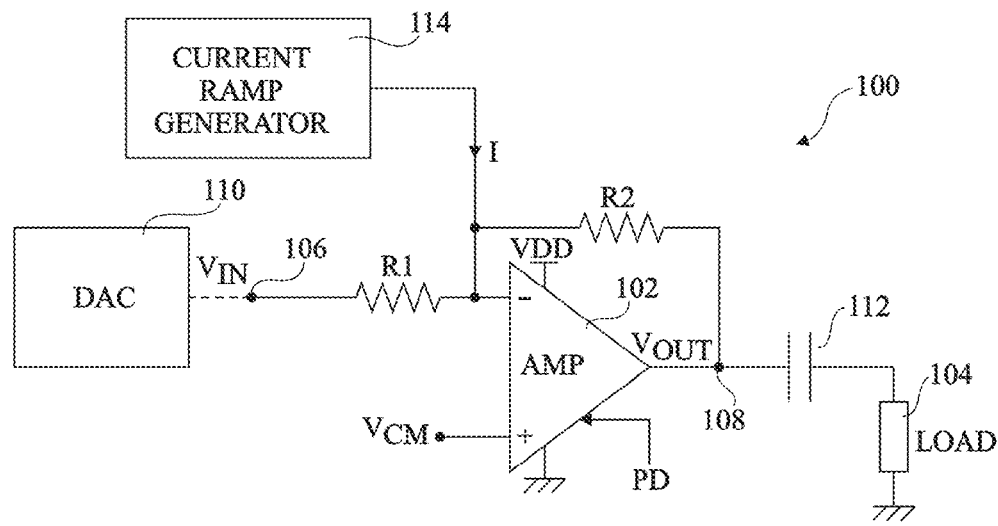
FIG. 1 schematically illustrates an audio amplifier coupled to a load according to an example embodiment of the present disclosure.

FIG. 1 illustrates an amplifier circuit 100 according to an example embodiment of the present disclosure. The circuit 100 comprises an amplifier (AMP) 102, which is for example a differential amplifier, such as an operational amplifier. The output of the amplifier 102 drives a load (LOAD) 104, such as speakers or headphones. The amplifier circuit 100 is coupled in an inverting amplifier configuration, with a resistor R1 coupled between a negative input node of the amplifier 102 and an input node 106 of the amplifier circuit, and a resistor R2 coupled between the negative input node and an output node 108 of the amplifier 102. The resistors R1 and R2 each for example have a resistance in the range 1 k to 100 k ohms, and the ratio between their resistances determines the gain of the inverting amplifier.

A positive input node of the amplifier is for example coupled to a common mode voltage $V_{CM}$. The amplifier 102 is for example coupled to a supply voltage rail for receiving a supply voltage VDD and to a ground voltage rail. The common mode voltage is for example at a level substantially equal to half of the supply voltage VDD. In alternative embodiments, rather than being at ground, the low voltage rail could be at a different voltage level such as a negative voltage, and the common mode voltage is for example at around a mid-point, different to the ground of the load 104, between the voltage levels of the supply voltage rail and low voltage rail.

The input node 106 receives an input signal $V_{IN}$ to be amplified. The input signal $V_{IN}$ is for example provided by a digital to analogue converter (DAC) 110, which for example receives a digital signal (not shown), and converts the digital signal into the analogue input signal $V_{IN}$. In alternative embodiments, rather than a DAC, a different type of input circuit could provide the input signal $V_{IN}$.

The output node 108 of the amplifier 102 is coupled via a coupling capacitor 112 to the load 104. The coupling capacitor for example has a capacitance in the range 1 to 500 µF depending on the resistance of the load and the signal bandwidth. In one example, the load is 16 ohms, and the coupling capacitor has a capacitance of around 120 µF. In another example, the load is 10 k ohms, and the coupling capacitor has a capacitance of around 1 µF. In some embodiments the coupling capacitor 112 is mounted off-chip.

The amplifier circuit 100 further comprises a current ramp generator (CURRENT RAMP GENERATOR) 114 coupled, in the example of FIG. 1, to the negative input node of the amplifier 102, and adapted to supply a current ramp to this node during a power up or power down phase of the amplifier circuit, in order to control the rate of charge or discharge of the coupling capacitor 112. In this way, pop noise can be reduced or prevented.

In particular, during a power up phase of the amplifier 102, initially the input signal $V_{IN}$ is held at a fixed level, for example at the common mode voltage $V_{CM}$. The amplifier is then powered up. For example, in one embodiment the amplifier 102 comprises an input for receiving a power down signal PD that is asserted during the power down phase of the amplifier 102 in order to deactivate one or more current branches of the amplifier 102. To power up the amplifier 102, the signal PD is for example brought to a level that activates the current branches of the amplifier 102. The current ramp generator 114 is then adapted to generate a current ramp that starts at an initial level high enough to saturate the amplifier 102. Thus the output of the amplifier 102 is at or close to the level of the low supply voltage, for example at ground. While the current is supplied to the input node of the amplifier 102, the circuit operates as a trans-impedance amplifier, in other words as a current to voltage converter, the voltage at the output being a function of the level of the current.

Assuming that the low supply voltage is at ground, the voltage $V_{OUT}$ at the output of the amplifier 102 is equal to $V_{CM}$–R2*I. The current I is for example initially chosen such I*R2 is equal to at least $V_{CM}$, so that the amplifier 102 is saturated. The current I is then reduced to a low level. In order to avoid a current through the coupling capacitor 112 that could cause pop noise, the gradient of the current ramp is for example chosen such that the voltage $V_{OUT}$ at the output of the amplifier 102 does not vary by more than a certain threshold, for example chosen to be between 1 and 10 V/s depending on the type of load, and for example such that the voltage gradient is at least 1 V/s. The current for example falls to a low level of zero or close to zero that can be considered as a negligible level. For example, the current falls to a level of 1 µA or less.

Once the current I reaches the low level, the input signal $V_{IN}$ is for example applied to the input node 106, and the amplifier circuit 100 operates normally to amplify the input signal $V_{IN}$ and drive the load 104.

During a power down phase of the amplifier circuit 100, the operation is for example the reverse of the power up phase described above. In particular, the input signal $V_{IN}$ is for example brought low, and a rising current ramp is applied by the current ramp generator 114 to the negative input node of the amplifier 102. When the current reaches the level at which the amplifier 102 is saturated, its output voltage being at or close to the low supply voltage, for example ground, the amplifier 102 is powered down, for example by asserting the power down signal PD.

Figure 2:
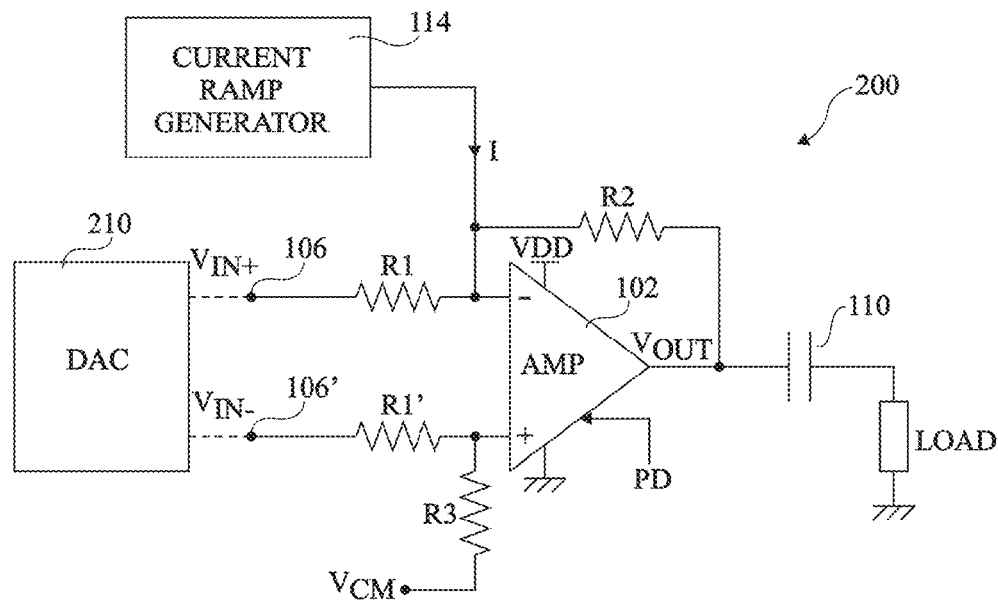
FIG. 2 schematically illustrates an audio amplifier coupled to a load according to a further example embodiment of the present disclosure.

FIG. 2 schematically illustrates an amplifier circuit 200 very similar to that of FIG. 1, and like features have been labelled with like reference numerals and will not be described again in detail. However, in the embodiment of FIG. 2, the amplifier 102 is driven by differential input signals. Indeed, rather than being connected directly to the common-mode voltage $V_{CM}$, the positive input node of the amplifier 102 is coupled to the common mode voltage $V_{CM}$ via a resistor R3. Furthermore, the positive input node is additionally coupled via a further resistor R1' to a further input node 106' of the amplifier circuit. The input nodes 106 and 106' receive differential input signals $V_{IN+}$ and $V_{IN-}$, which are for example provided by a DAC 210, based on a digital input signal (not illustrated). As with the DAC 110, in alternative embodiments the DAC 210 could be replaced by a different type of input circuit.

Operation of the circuit of FIG. 2 is for example very similar to that of FIG. 1, and will not be described again in detail.

In one embodiment, the current ramp generator 114 of FIGS. 1 and 2 is adapted to generate linear current ramps. An example of a circuit for generating such linear current ramps will now be described in more detail with reference to FIG. 3.

FIG. 3 schematically illustrates the current ramp generator 114 according to an example embodiment in which it comprises a differential amplifier 304 having its negative input node coupled to an input node 305 receiving a voltage signal V1, and having its output node 306 coupled to the control nodes of transistors 308 and 310, which are for example MOS transistors. The transistor 308 is coupled by its main current nodes, for example its source and drain nodes in the case that it is a MOS transistor, between the supply voltage VDD and the positive input node of the differential amplifier 304. The positive input node is also coupled to ground via a resistor 312. The transistor 310 for example has one or its main current nodes coupled to the supply voltage VDD, and its other main current node provides the current I at the output of the current ramp generator.

The voltage signal V1 is generated by a voltage ramp generation circuit 314. FIG. 3 illustrates an example of this circuit, which for example comprises a capacitor 316 coupled between the node 305 and ground. The capacitor 316 is for example adapted to be charged by a current source 318, which is for example coupled in series with a switch 320 between the node 305 and the supply voltage VDD. The capacitor 316 is for example adapted to be discharged by a current source 322, which is for example coupled in series with a switch 324 between the node 305 and ground.

Operation of the current ramp generator 314 of FIG. 3 will now be described with reference to FIGS. 4A and 4B.

FIG. 4A is a graph illustrating examples of the voltage signal V1, and FIG. 4B is a graph illustrating examples of the current signal provided by the current ramp generator 114.

As illustrated in FIG. 4A, during the power up phase of the amplifier circuit of FIG. 1 or 2, the voltage signal V1 comprises a falling voltage ramp which for example starts at a level 402, and then falls in a linear fashion to a level at or close to the ground voltage.

As illustrated in FIG. 4B, the falling voltage ramp causes a corresponding falling current ramp, which starts at a level 404 and falls in a linear fashion to a level at or close to zero. The initial level 404 and gradient of the falling current ramp are determined by the initial level 402 and gradient of the falling voltage ramp of signal V1.

Referring again to FIG. 4A, during a power down phase of the amplifier circuit of FIG. 1 or 2, the voltage signal V1 comprises a rising voltage ramp, which for example starts at a low level at or close to ground, and rises in a linear fashion to the level 402.

Referring again to FIG. 4B, the rising voltage ramp causes a corresponding rising current ramp, which starts at a level close to or at zero, and increases in a linear fashion to the level 404. The final level 404 and gradient of the rising current ramp are determined by the final level 402 and gradient of the rising voltage ramp of the signal V1.

Pop noise is generally defined by the amplitude of the peak voltage on the load. The value is expressed in dBV A-weighting, which takes into account the loudness perceived by the human ear. The behaviour of the human ear is generally modelled by a band pass filter, called the A-weighting filter.

The linear current ramp in the example of FIG. 4B has a gradient that is relatively low, resulting in a low frequency spectrum not audible by the human ear. Such a linear ramp is for example relatively long, for example between 500 ms and 1 s, and in some embodiments it may be desirable to have a faster ramp to accelerate the power up and power down sequences of the audio amplifier.

The present inventors have noted that the shape of the A-weighting filter and the shape of high-pass DC-blocking filter formed by the coupling capacitor and the load, correspond in the time domain to two derivations applied to the output signal of the amplifier. However, the linear shape of the ramp contains discontinuities at the beginning and at the end that generate a wide spectrum signal in the audio band, which is not filtered by the two filters. Therefore, in some embodiments, a non-linear current ramp is advantageously used instead of a linear current ramp.

FIG. 5 illustrates the current ramp generator 114 of FIGS. 1 and 2 according to an alternative example embodiment in which the generated current ramps are non-linear. The generator 500 of FIG. 5 comprises a differential pair 502, 504. Each transistor 502, 504 of the differential pair has one of its main current nodes coupled to a common node 506, which is in turn coupled to ground via a current source 508. The transistor 502 has its other main current node coupled to the supply voltage VDD, and is controlled at its control node by a voltage signal V2, which comprises a voltage ramp. The other main current node of the transistor 504 provides the current I at the output of the current ramp generator 500, and is controlled at its control node by a voltage signal V1. In some embodiments, the voltage signal V1 comprises a voltage ramp having a gradient of the opposite sign to the voltage ramp V2. The voltage ramps V1 and V2 are for example generated by voltage ramp generators (not illustrated) similar to the generator 314 of FIG. 3. In alternative embodiments, either of the voltages V1 and V2 could be at a fixed voltage level, for example at the common mode voltage $V_{CM}$.

Operation of the circuit of FIG. 5 will now be described with reference to the timing diagrams of FIGS. 6A and 6B.

FIG. 6A is a graph illustrating examples of the voltage signals V1 and V2, and FIG. 6B is a graph illustrating examples of the current signal provided by the current ramp generator 500.

As illustrated in FIG. 6A, during the power up phase of the amplifier circuit of FIG. 1 or 2, the voltage signal V1 comprises a falling voltage ramp, which for example starts at a level 602, and then falls in a linear fashion to a level at or close to the ground voltage, while the voltage signal V2 comprises a rising voltage ramp, which for example starts at a level at or close to the ground voltage, and rises in a linear fashion to the level 602.

As illustrated in FIG. 6B, the rising and falling voltage ramps of signals V1 and V2 cause a falling current ramp, which starts at a level 604 and falls to a level at or close to zero. However, rather than falling in a linear fashion, the current ramp has a hyperbolic form, with smooth gradient transitions rather than corners at the start and end of the ramp. The initial level 604 and maximum gradient of the current ramp are determined by the initial level 602, the size of the current source 508, and gradient of the voltage ramps of the signals V1 and V2.

Referring again to FIG. 6A, during a power down phase of the amplifier circuit of FIG. 1 or 2, the voltage signal V1 comprises a rising voltage ramp, which for example starts at a low level at or close to ground, and rises in a linear fashion to the level 602, while the voltage signal V2 comprises a falling voltage ramp, which starts at the level 602 and falls in a linear fashion to a level at or close to the ground voltage.

Referring again to FIG. 6B, the rising and falling voltage ramps of the signals V1 and V2 cause a rising current ramp, which starts at a level close to or at zero, and increases to the level 604. However, rather than increasing in a linear fashion, the current ramp has a hyperbolic form, with smooth gradient transitions rather than corners at the start and end of the ramp. This leads to a reduction in the second derivative of the current ramp, and thus for a given acceptable level of pop noise, the ramp can rise and fall faster than in the case of a linear ramp.

An advantage of the embodiments described herein is that pop noise can be reduced or entirely suppressed by a simple circuit, and without needing the use of a DAC. Furthermore, by implementing a current ramp generator using a differential pair as described in relation to FIGS. 5, 6A and 6B, a current ramp can be generated without corners, further reducing the risk of pop noise and/or accelerating the power up and power down sequences.

Having thus described at least one illustrative embodiment, various alterations, modifications and improvements will readily occur to those skilled in the art.

For example, it will be apparent to those skilled in the art that the supply voltages described herein could be at any level, and the ground voltage could be replaced by a positive or negative voltage. Furthermore, while the common mode voltage is described as being at a mid-point between the high and low supply voltages, other levels would be possible.

Furthermore, it will be apparent to those skilled in that art that, while audio amplifiers have been described in relation to FIGS. 1 and 2 based on inverting amplifier configurations, in other embodiments different amplifier configurations would be possible.

It will also be apparent to those skilled in the art that other forms of ramp could be used, and that the circuits represented in FIGS. 3 and 5 for implementing a current ramp generator are merely examples, and that many other circuit designs would be possible.

Furthermore, it will be apparent to those skilled in the art that the various features described in relation to the various embodiments could be combined, in alternative embodiments, in any combination.

The invention claimed is:

1. An amplifier circuit comprising:
   an amplifier having a first input coupled to an input node of the amplifier circuit via a first resistor and an output coupled to a load via a coupling capacitor, the output being coupled to the first input via a second resistor; and
   a current ramp generator adapted to supply a linear or non-linear current ramp to the first input of the amplifier during a power up phase of the amplifier circuit to control the rate of charge or discharge of the coupling capacitor, the linear or non-linear current ramp starting at a first level and falling to a second level.

2. The amplifier circuit of claim 1, wherein during a power down phase of the amplifier circuit the current ramp generator is adapted to supply a further linear or non-linear current ramp to the first input of the amplifier, the further linear or non-linear current ramp starting at the second level and rising to the first level.

3. The amplifier circuit of claim 1, wherein the first level is high enough to cause saturation of the amplifier.

4. The amplifier circuit of claim 1, wherein the second level is equal to or less than 1 μA.

5. The amplifier circuit of claim 1, wherein the linear or non-linear current ramp has a gradient that results in a voltage gradient at the output of the amplifier circuit of at least 1 V/s.

6. The amplifier circuit of claim 1, wherein the current ramp generator is adapted to convert a first voltage ramp into the linear or non-linear current ramp.

7. The amplifier circuit of claim 6, wherein the current ramp generator comprises a differential pair, a first of the transistors of the differential pair being controlled by the first voltage ramp.

8. The amplifier circuit of claim 7, wherein a second of the transistors of the differential pair is controlled by a second voltage ramp having a gradient of opposite sign to the first voltage ramp.

9. The amplifier circuit of claim 1, wherein the amplifier is coupled in an inverting amplifier configuration.

10. The amplifier circuit of claim 1, wherein the input node of the amplifier circuit couples to a digital-to-analog converter (DAC) and receives an input signal from the DAC.

11. The amplifier circuit of claim 10, wherein the current ramp generator is coupled between the first and second resistors.

12. An amplifier circuit comprising:
    an amplifier having a first input coupled to an input node of the amplifier circuit via a first resistor and an output coupled to a load via a coupling capacitor, the output being coupled to the first input via a second resistor; and
    a current ramp generator adapted to supply a linear or non-linear current ramp to the first input of the amplifier during a power down phase of the amplifier circuit to control the rate of charge or discharge of the coupling capacitor, the linear or non-linear current ramp starting at a second level and rising to a first level.

13. The amplifier circuit of claim 12, wherein the first level is high enough to cause saturation of the amplifier.

14. The amplifier circuit of claim 12, wherein the second level is equal to or less than 1 μA.

15. The amplifier circuit of claim 12, wherein the input node of the amplifier circuit couples to a digital-to-analog converter (DAC) and receives an input signal from the DAC.

16. The amplifier circuit of claim 15, wherein the current ramp generator is coupled between the first and second resistors.

17. A method of powering up an amplifier circuit, comprising:
    supplying a linear or non-linear current ramp to a first input of an amplifier of the amplifier circuit, the first input being coupled to an input node of the amplifier circuit via a first resistor an output of the amplifier being coupled to a load via a coupling capacitor and to the first input via a second resistor, wherein the linear or non-linear current ramp starts at a first level and falls to a second level and controls the rate of charge or discharge of the coupling capacitor; and
    applying an input signal to the input node of the amplifier circuit.

18. The method of claim 17, further comprising generating the linear or non-linear current ramp by a current ramp generator and generating the input signal by a digital-to-analog converter (DAC).

19. A method of powering down an amplifier circuit, comprising:
    supplying a linear or non-linear current ramp to a first input of an amplifier of the amplifier circuit, the first input being coupled to an input node of the amplifier circuit via a first resistor an output of the amplifier being coupled to a load via a coupling capacitor and to the first input via a second resistor, wherein the linear or non-linear current ramp starts at a second level and rises to a first level and controls the rate of charge or discharge of the coupling capacitor; and applying an input signal to the input node of the amplifier circuit.

20. The method of claim 19, further comprising generating the linear or non-linear current ramp by a current ramp generator and generating the input signal by a digital-to-analog converter (DAC).

* * * * *